United States Patent [19]
Yassaie et al.

[11] Patent Number: 5,943,065
[45] Date of Patent: Aug. 24, 1999

[54] VIDEO/GRAPHICS MEMORY SYSTEM

[75] Inventors: Hossein Yassaie, Chesham; John Anthony Metcalfe, Dunstable; Graham Deacon, Hemel Hempstead; Martin Ashton, Berkhampsted, all of United Kingdom

[73] Assignee: VideoLogic Limited, Hertfordshire, United Kingdom

[21] Appl. No.: 08/244,399

[22] PCT Filed: Nov. 23, 1992

[86] PCT No.: PCT/GB92/02164

§ 371 Date: Jul. 21, 1994

§ 102(e) Date: Jul. 21, 1994

[87] PCT Pub. No.: WO93/10518

PCT Pub. Date: May 27, 1993

[30] Foreign Application Priority Data

Nov. 21, 1991 [GB] United Kingdom .................... 9124787
Mar. 20, 1992 [GB] United Kingdom .................... 9206066

[51] Int. Cl.⁶ ..................................................... G09G 3/36
[52] U.S. Cl. ............................................. 345/509; 345/518
[58] Field of Search ..................................... 345/190, 193, 345/200, 201, 189, 112, 113, 114, 115, 116, 515, 516, 508, 509, 518; 395/518, 509

[56] References Cited

U.S. PATENT DOCUMENTS

| | | | |
|---|---|---|---|
| 4,165,072 | 8/1979 | Stubben | 345/190 |
| 4,257,043 | 3/1981 | Tsuchiko | 345/115 |
| 4,297,694 | 10/1981 | Matherat | 345/193 |
| 4,471,348 | 9/1984 | London et al. | 345/2 |
| 4,812,836 | 3/1989 | Kurakake et al. | 345/201 |
| 4,825,411 | 4/1989 | Hamano | 365/189.04 |
| 4,835,774 | 5/1989 | Ooshima et al. | 371/21 |
| 4,891,631 | 1/1990 | Fredlund et al. | 345/160 |
| 5,001,671 | 3/1991 | Koo et al. | 365/230.05 |
| 5,027,212 | 6/1991 | Marlton et al. | 345/133 |
| 5,157,776 | 10/1992 | Forster | 395/425 |
| 5,220,312 | 6/1993 | Lumelsky et al. | 345/200 |
| 5,231,383 | 7/1993 | Diepstraten et al. | 345/200 |
| 5,274,753 | 12/1993 | Roskowski et al. | 345/116 |
| 5,402,147 | 3/1995 | Chen et al. | 345/115 |
| 5,512,918 | 4/1996 | Forrest et al. | 345/122 |

FOREIGN PATENT DOCUMENTS 0 245 564  11/1987  European Pat. Off. .

OTHER PUBLICATIONS

IRE Wescon Conference Record, vol. 34, Nov. 1990, North Hollywood, CA, US, pp. 18–23, "Multiport DRAM Trends".

Micron Technology, Inc. "Triple Port DRAM", MT43C4257/8, Jan. 1991, pp. 1–16.

Electronic Design, May 24, 1990, San Jose, CA, "Triple–ort Dynamic RAM Accelerates Data Movement", Dave Bursky, 3 pages.

*Primary Examiner*—Amare Mengistu
*Attorney, Agent, or Firm*—Flynn, Thiel, Boutell & Tanis, P.C.

[57] ABSTRACT

A video/graphics memory system includes a memory device (30) having a memory core (14) and first and serial registers (16, 36). The memory device thus has a random-access port (24) for graphics data, a first serial access port (22) for image output to a display, and an auxiliary or second serial port (32) for input and output of video signal data. A single memory thus stores both video and graphics data, while the processor still has access to the random access port of the memory. Two video outputs can be provided simultaneously, or the data withdrawn through the auxiliary port can be subject to processing and then written back into the memory. In alternative arrangements, instead of using triple-ported RAM, the auxiliary port is provided by the use of external multiplexing circuitry.

29 Claims, 11 Drawing Sheets

VIDEO/GRAPHICS MEMORY SYSTEM

BACKGROUND OF THE INVENTION

This invention relates to a computer-based video/graphics memory system, namely method and apparatus.

As is well known, one form of computer memory is random access memory (RAM). This is in integrated circuit form, and may take the form of dynamic RAM or DRAM, or static RAM or SRAM. All types of RAM have a port through which random accesses to the memory locations may be made.

There is a need to use memory in a video/graphics or multi-processing applications. 'Multi-media' is now becoming an important application of computer systems in which video signals at standard video line and field rates are intermixed for display with computer-generated graphics images. For display and for other purposes multiple sources and destinations of data need to have efficient and timely access to a common memory or storage device. It may be required to have simultaneous access to video, graphics and processed image data.

Conventional graphics sub-systems use dual-ported VRAM (video random access memory). The random access port is used by a host processor, or if present, a graphics processor, to create a graphics image by writing pixel values into a two-dimensional pixel array within the DRAM (dynamic RAM) core of the VRAM. A serial access port (SAM) is dedicated to reading out that data in raster line format, to refresh a cathode ray tube (CRT) display. The two ports, namely the normal random access port and the serial access port, function independently, except during transfers from the serial access port to DRAM core and vice versa.

There are problems in coordinating computer graphics and video signals in a single system. Our U.S. Pat. No. 5,027,212 describes one system for use in combining graphics and video information on a single display. Although extremely useful, there are limits on the capabilities of the system described in that patent.

SUMMARY OF THE INVENTION

The present invention in its various aspects is defined in the independent claims below, to which reference should now be made.

Various preferred embodiments are described below with reference to the drawings. In all these embodiments a memory device is provided with a random-access port for graphics data, a serial access port for output of data to a display, and an auxiliary port for video signal data. The data locations in the memory can selectively store both graphics data and video data. Thus video and graphics data can be overlaid on each other. Also, a video output can be made available additional to that through the serial access port. Finally data can be withdrawn through the auxiliary port, stored and/or processed and re-written back into memory, possibly at a different location.

The memory device can be a triple-ported semiconductor device, or can be dual or single ported memory provided with external multiplexing circuitry.

BRIEF DESCRIPTION OF THE DRAWINGS

Preferred embodiments of the invention will now be described in more detail by way of example with reference to the accompanying drawings, in which.

DETAILED DESCRIPTION OF THE PREFERRED EMBODIMENTS

Figure 1:
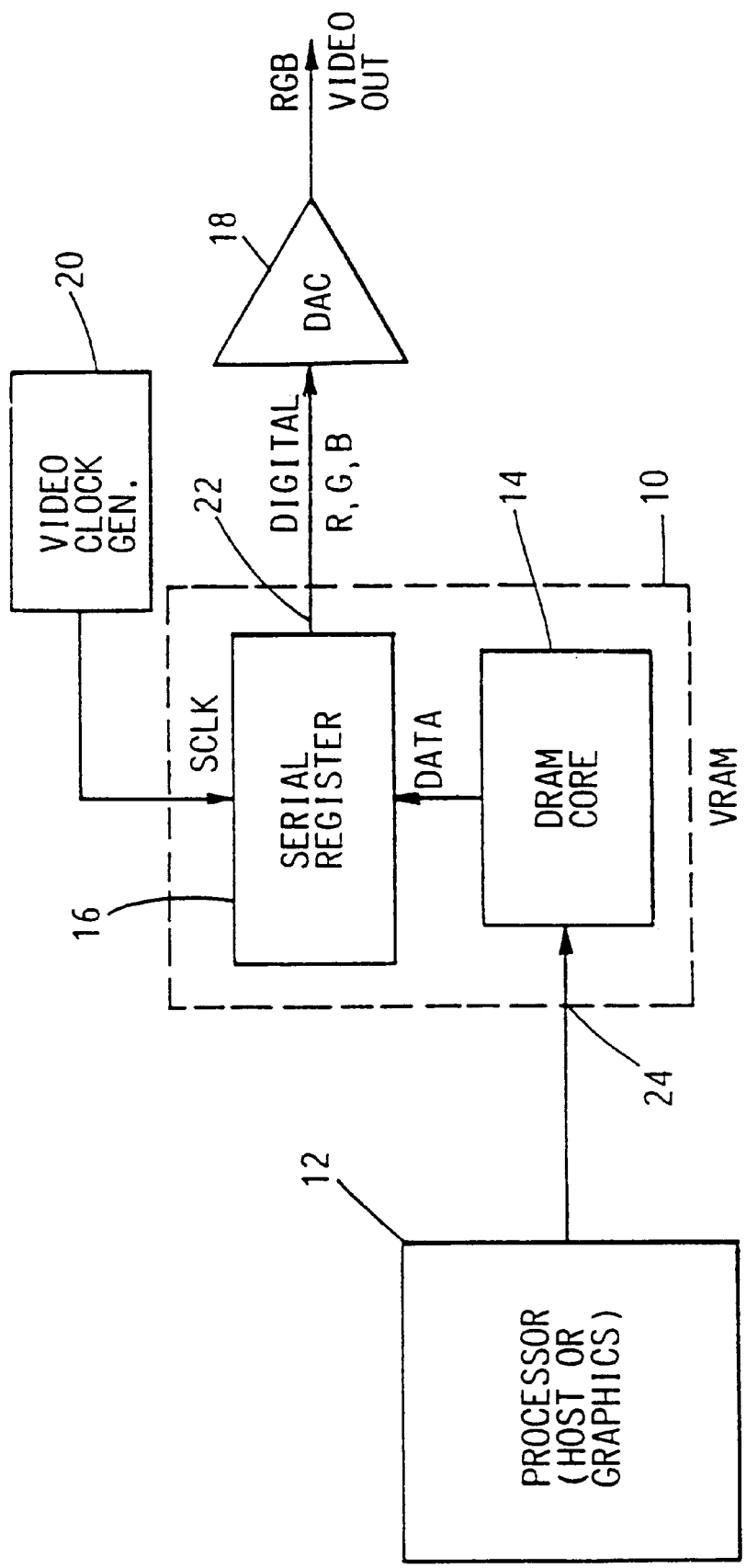
FIG. 1 is a block diagram of a conventional graphics display system illustrating the VRAM.

A typical known computer graphics and/or video input system is shown in FIG. 1. FIG. 1 shows a VRAM (video random access memory) memory 10 coupled to a host processor or graphics processor 12 through the VRAM random access port 24. The serial access port 22 provides a digital R, G, B output through digital-to-analog converters 18 to produce an RGB video output. The VRAM memory 10 also receives clock signals from a video clock generator 20. The VRAM memory 10 contains a DRAM (dynamic random access memory) core 14 which provides output to a serial output register 16 the contents of which are read serially out through the serial access port 22.

In use, the VRAM 10 stores the computer graphics information generated by the host or graphics processor 12 via the random access port 24. Transfer cycles are used to transfer information from the DRAM core 14 to 512×4 bit serial registers 16 which typically hold up to a line of screen display information. The video output system will then clock data in response to the clock generator 20 serially out of the serial port 22 to feed to video digital-to-analogue converters (DACs) 18. The whole bandwidth or capacity of the serial port 22 is used in displaying, ie. outputting, video.

FIRST EMBODIMENT

Basic System

The first embodiment which will now be described, and which is illustrated FIGS. 2 to 7 of the drawings, makes use of a triple-ported DRAM type number MT43C4257 or MT43C4258 made by Micron Technology Inc., Boise, Id., USA. This DRAM has one random access port, and two identical bidirectional serial access ports referenced SAM A and SAM B. By use of such a memory, it is possible to produce an accelerated 24-bit high-resolution graphics system which can accept video input and provide video output, and which uses the random access port SAM A conventionally, but uses SAM B in ways not hitherto proposed.

In the above-mentioned integrated circuit, each SAM port is four bits wide. By using a conventional pixel-interleaved memory organization; a 96-bit wide bus can be provided on SAM A and a 28-bit wide bus on SAM B. The SAM B bus is divided into a 24-bit pixel bus, and a 4-bit ancillary bus. The 24 bits provide 8 bits of definition for each of three colour components RGB of a colour display.

Figure 2:
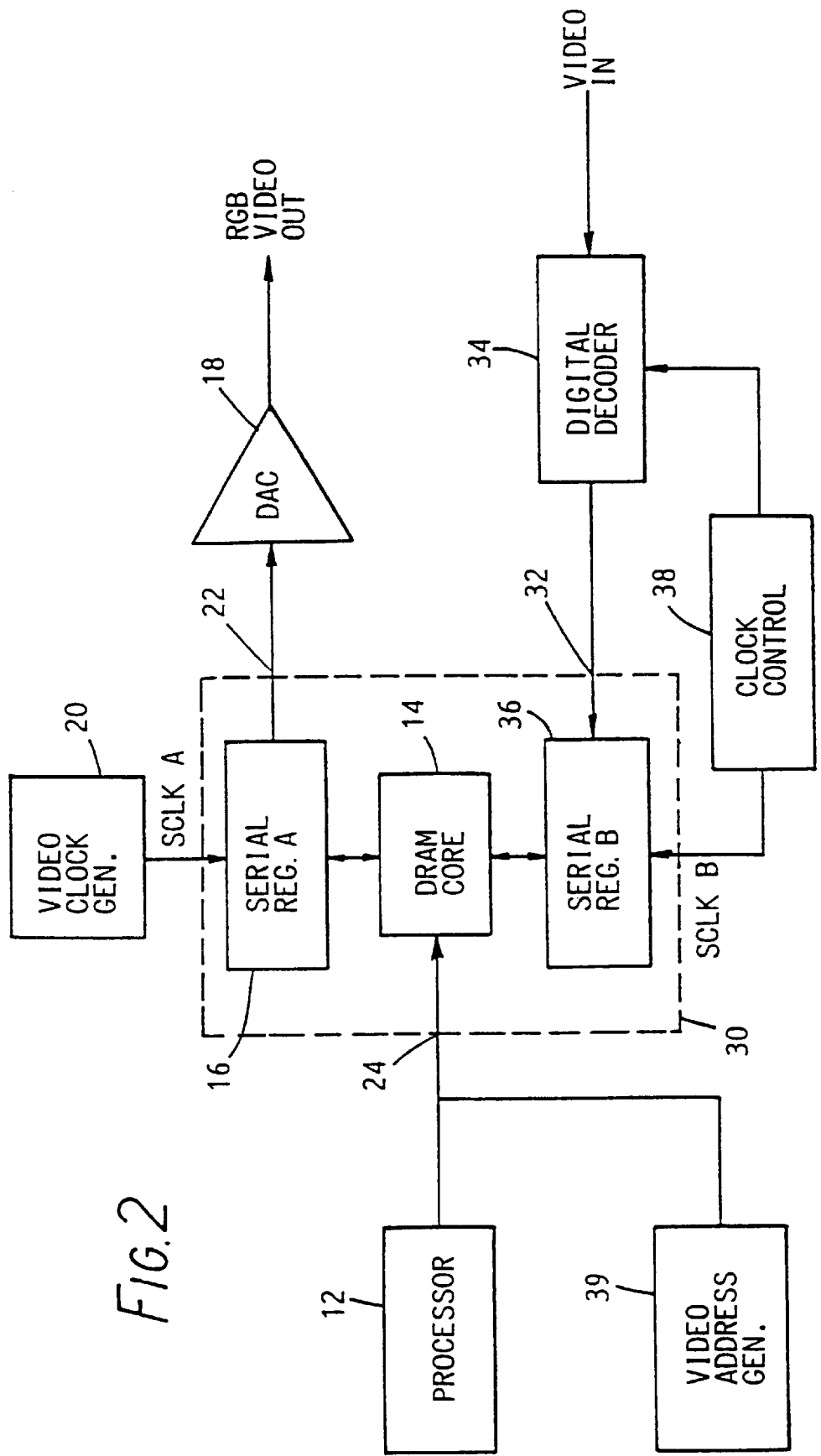
FIG. 2 is a similar diagram of a first graphics/video system in accordance with the present invention.

A block diagram of a first video input system embodying the invention is shown in FIG. 2. The circuit uses a triple-ported dynamic random access memory (TPR) 30 instead of the circuit 10 of FIG. 1. In addition to the serial port 22, this includes a second or auxiliary serial port 32 and a second serial register 36. The second register 36 can receive data from a digital decoder 34, and the second port can be independently clocked by a clock control circuit 38. Thus there are two independent asynchronous bidirectional serial access ports in addition to the conventional RAM port 24. The circuit is preferably an integrated circuit No. MT43C4257 from Micron Technology Inc., Boise, Id., USA.

The video output DAC 18 and clock generation 20 is entirely conventional as is the graphics/host processor 12. In normal operation the processor 12 accesses the DRAM core 14 to write graphics data and to perform transfer operations between the core 14, and serial register A (16). Serial Port B (32) is therefore freely available for video input.

The video decoder system 34 is of itself conventional and converts an incoming video data stream to a digital format (or alternatively any digital data stream e.g. decompressed digital video data from a disc may be used). This digital data is clocked into the serial register B of the TPR 30 under the control of the clock logic 38. This is entirely independent of the host processor 12 and does not interfere with the normal graphics operations or digital video output.

When the required amount of data has been loaded into the shift register 36, the address logic will request a bus cycle and perform a transfer cycle to transfer the register B contents to the DRAM core 14 under the control of video address generator 39. This is the only incursion on the graphics processor bandwidth through random access port 24. Once in the core, the input video data is indistinguishable from data written by the graphics processor 12, and will be displayed as part of the normal graphics display.

For a color picture there will normally be six TPRs each of which holds 4 bits of data i.e. half a monochrome frame. Two are required for each color.

Inlaying Graphics with Video

The TPRs have 512 mask bits per serial register i.e. one per 4 bit cell. The concept of a mask plane is well-known in graphics applications. In this case a single line of mask bits is provided for each pixel of a line of the image when stored in the serial register 16 or 36. When the contents of the serial register is transferred back into the DRAM core 14, the mask bit for each cell is first checked. If it is not set then the cell data overwrites the data in the DRAM core. If it is set, then the write operation is masked and the DRAM core cell data is not altered. Hence the mask bit controls whether video or core data is stored in the core on a pixel-by-pixel basis. The mask data bit is written into the serial register together with the video data stream.

The mask bits can be generated in various ways depending upon the shape of the video window to be displayed; however the ability to control the mask bit on a pixel-by-pixel basis enables an arbitrary mix of video or computer graphics information to be stored.

One possible way to generate the mask is to provide an additional bit-plane in the display memory by means of an additional TPR. The host processor 12 writes mask data into this plane on an arbitrary basis. The video address generator 39 can then transfer this data from the core into serial register B. The TPR containing that data is then set, so that the serial register is in output mode, but the register B ports on the other TPRs containing normal video are set to input mode. The mask bits are then read out of the mask plane TPR and are written along with the video data to the appropriate B ports of the video TPRs. The mask data should be read out of one TPR at the same time as (or at most one clock earlier than) the corresponding data is being written into the serial register B on the other TPRs.

When the video data is transferred to the DRAM core 14 the mask bits will ensure that video only overwrites data that was not masked, giving an arbitrary mix of video and computer-generated data. In this way input video can be inlaid into a graphics image.

Windowing with Full Motion Video

It is possible to input a full motion video source into a window in the graphics image. The digitized video is stored in and displayed from the single-buffered RGB graphics planes of the store.

The limitations of this approach when implemented with conventional VRAM are that the video data, which has to be input through the random access port 24, reduces the available graphics bandwidth, and that graphics data cannot be overlaid onto moving video. This typically causes problems in a graphics user interface (GUI) environment when the cursor, other windows or pull-down menus fall inside the video window.

In the present system a video input circuit (not shown) can convert baseband analogue video from an external source into 24-bit RGB pixels at standard line rate; this digital video stream is then written into the graphics store through the serial register B or SAM B. By controlling the tap addresses and SAM-to-core transfers appropriately, using the principles described above, the video data can overwrite the graphics data in any desired window on the screen, without interfering with the display refresh or reducing the graphics drawing speed. The use of the SAM port 32 for video input means that the random access port 24 is fully available for graphics drawing operations, and the overhead on both the host processor 12 and the system bus is very low.

In order that graphics data can be overlaid on full motion video, without being overwritten, a one-bit mask or key plane is defined in the pixel array which is updated as the graphics is redrawn to show where the video is allowed to overwrite the graphics. This key plane is used in the following way: as-each row of video is written into the SAM pixel port, the corresponding row of the key plane is read out of the SAM ancilliary port and written back into the mask register which is associated with the pixel port. When the SAM-to-core transfer for that row takes place, the mask register enables writes only to those pixels which were 'video enabled' in the key plane.

Position and Size of Image

The size and position and shape of the video image can be controlled by using different clocks to clock data into the TPR serial port from those used to read data from the digital decoder. For example, if the serial register 36 is clocked twice as fast as the data stream, then the image clock into the TPR will be expanded (amplified) by a factor of 2. By arbitrarily varying the clock rates and by use of appropriate buffers, the video image can be changed by any arbitrary value in the X direction.

Changes in the Y direction can either be performed by having a retransmittable line store or more easily by writing the contents of the serial register to more than one location in the DRAM core. For example a ×2 (times two) amplify in Y can be performed by writing one line of video data to the serial register 36 and transferring the same data to two consecutive line locations in the TPR 30. This can be extended to any arbitrary Y change.

For both X and Y size changes non-integer changes can be achieved by varying the rate at which pixels are replicated across the screen. For example if the first pixel (and line) is repeated twice, the second three times, the fourth twice etc., a zoom factor of 2.5 can be obtained.

The image can also be scrolled relative to the screen data without actually moving any data. The start position of the image is determined by a "tap pointer" internal to a TPR. This determines where the serial register will start accepting data when being written to. If it points to pixel 0 the video image will be written to pixel 0 corresponding to (for example) the left hand side of the screen display. By setting the tap pointer differently (e.g. 256) the video image will appear to have been scrolled to start at the centre of the screen. This control can be done either by the host/graphics processor 12 or by a separate controller (not shown) that steals cycles from the host/graphics processor. A similar effect is achieved in Y by changing where the serial register 36 is transferred to within the DRAM core 14.

Special effects can be achieved by mixing these two functions. For example a shear in X can be achieved by incrementing the tap pointer by an arbitrary amount on each successive line. By changing the amplification factor across a line the image could appear to be warped or even wrapped round a cylinder.

All these effects are possible without actually moving the data around.

Graphics Acceleration

Figure 3:
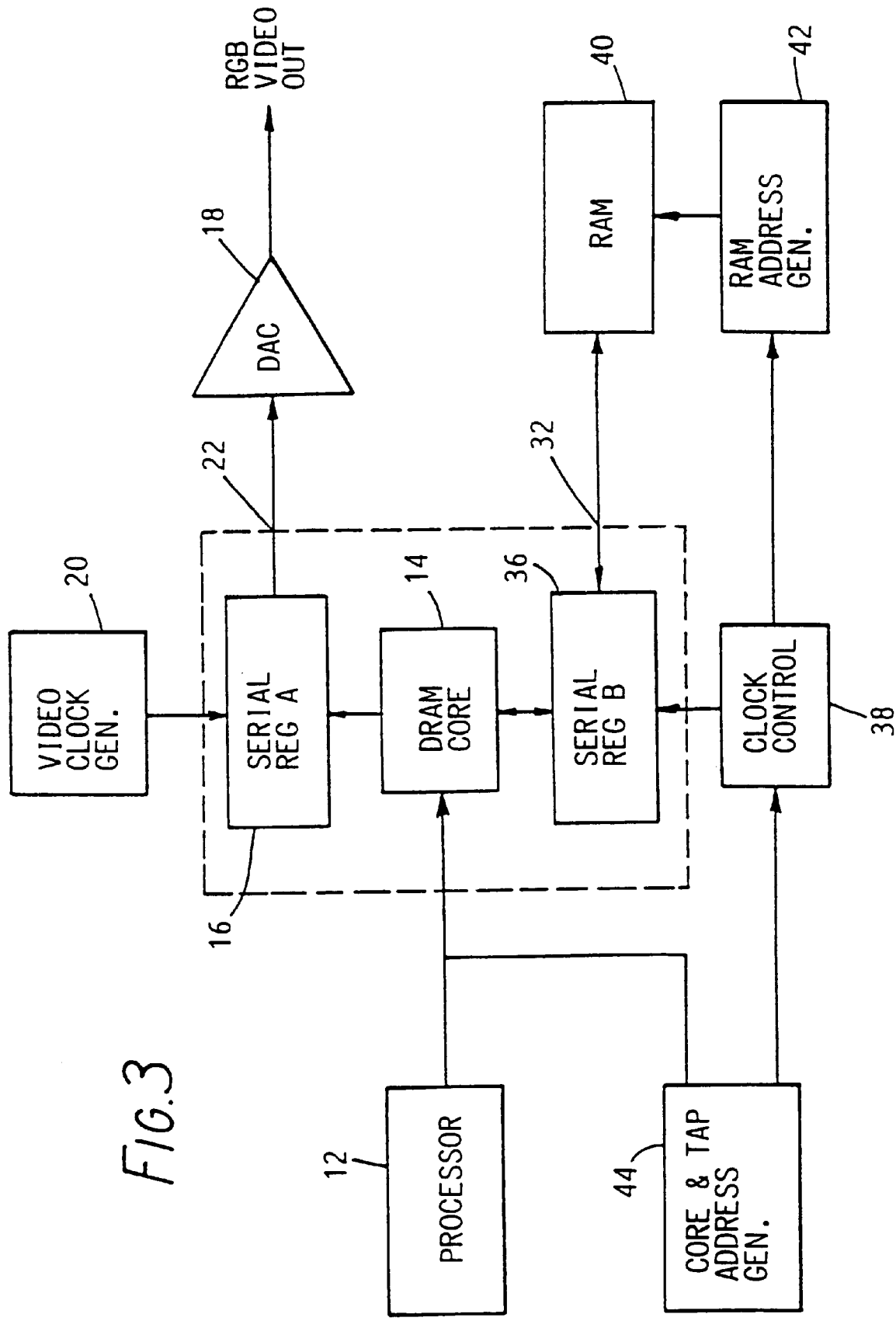
FIG. 3 is a block diagram illustrating a graphics accelerator which may be used in the system.

FIG. 3 shows an arrangement to provide fast copying and so-called "bit-blitting" of graphics information. A RAM 40, typically SRAM, is connected to the serial register 36. A line of data is transferred into the serial register 36 from the core 14 and then read out into the external RAM 40. The serial register 36 is then configured so that the tap pointer points to a different screen location. The line of data is then read out of the RAM 40 and written back into the serial register 36, but at a different tap pointer. The register contents are then transferred back into the core 14, but at a different line address. Hence the data will appear to have been moved around the screen in both x and y directions. By applying the same technique to each line in a screen area, an arbitrary copy of a data can be achieved. Appropriate addressing of RAM 40 is provided by an address generator 42, and a core and tap address generator 44 is connected to the host processor bus and the clock control 38. In actual fact the address generator 44 may be provided by the host processor 12.

Subject to suitable modification of the TPR 30, movement could be achieved by writing from the core into the on-chip serial register 36 and back to a different place in the core without the need to write to the external RAM 40.

Special effects are also possible by reading data from the RAM 40 in arbitrary sequences. Amplifying and zooming of an area can be performed by reading the same data out of the SRAM 40 several times and/or at different rates from the rate at which data is written into the serial register. A zoom can be achieved by reading every pixel from the SRAM 40 but writing it several times to consecutive serial register locations. An "Amplify by 4" can be achieved for example by reading every fourth pixel from the SRAM 40 and writing that same pixel to four consecutive locations in the serial register 36. Shearing in X can also be achieved, as can some warping or similar effects. Image reversal is achieved by writing data into the SRAM 40 in a (say) ascending address order and writing it out in (say) descending order. Two lines can be read out of store sequentially and logical operations conducted on them to generate a line to be written back, e.g. in a merge.

In general, by making use of the logical operations associated in the TPR with the serial register, it is possible to provide full emulation of bit-blitting operations, with arbitrary logic and two or three operands. The resultant of the logic operations appears an the graphics display.

Multiple Video Displays

Figure 4:
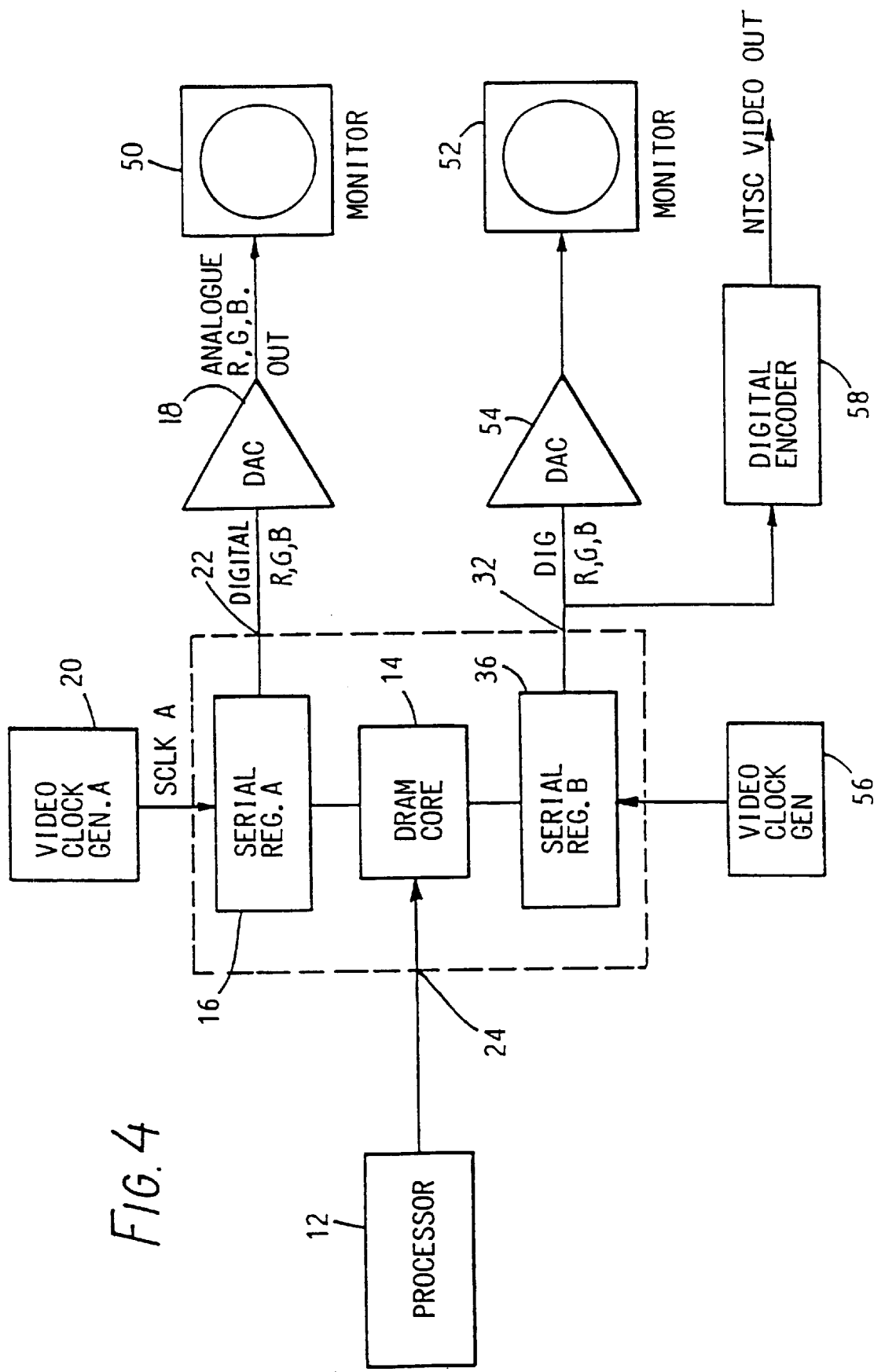
FIG. 4 is a block diagram illustrating the use of the system for multiple video displays and printing to a videotape.
Figure 5:
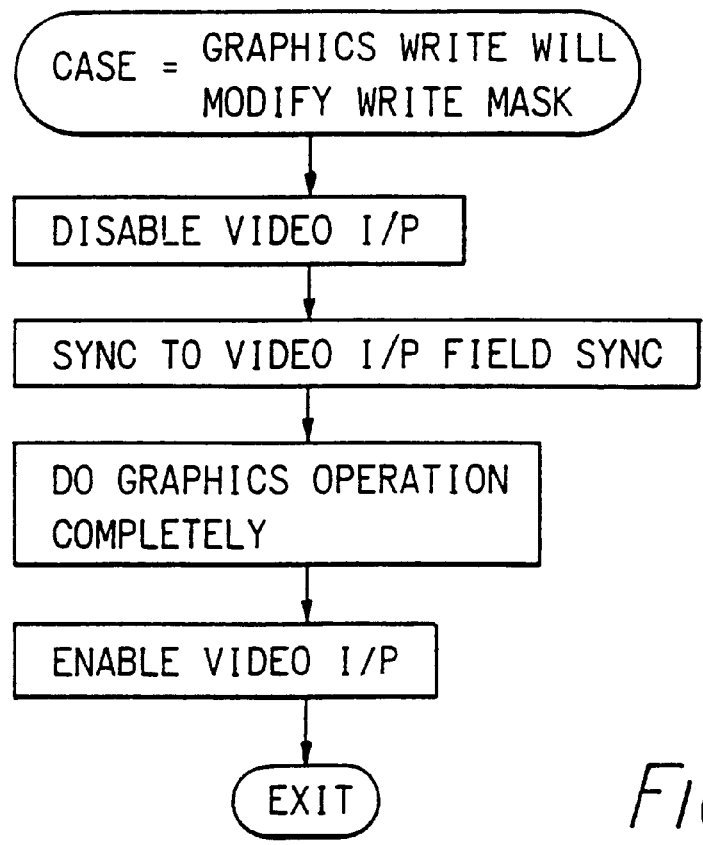
FIG. 5 is a flow diagram illustrating a software solution to a problem with masked usage.
Figure 6:
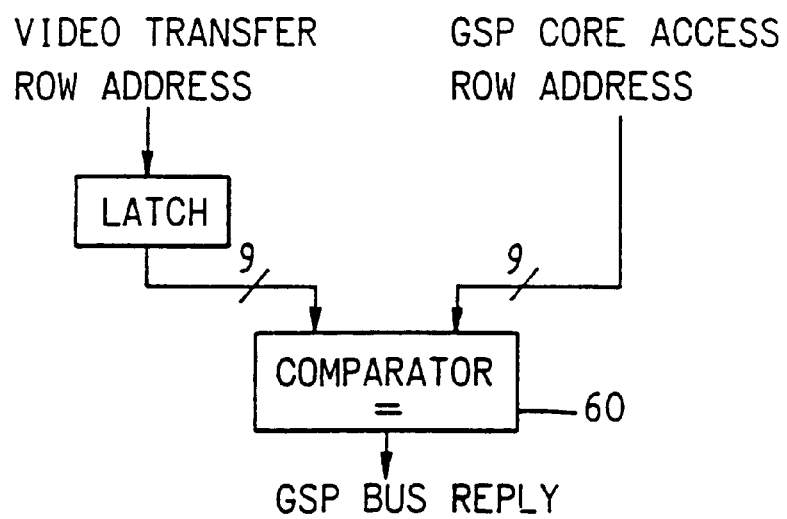
FIG. 6 is a block diagram illustrating components of a hardware solution to the same problem.

FIG. 4 shows a system enabling two separate screen displays 50,52 to be shown from the same area of memory 14. Serial register A and associated logic is entirely conventional. However, since serial register B is totally independent of register A, it can be used to generate a completely different screen display from that from port A. For this purpose there is an additional DAC 54, and the register 36 is clocked by a video clock generator 56.

In particular a rectangular subsection of the display generated from port A could be configured to be a complete display on port B. For example, port A might be displaying an application that used many different windows on screen for control information etc. at 1152×900 resolution. The final output of that application might be contained and displayed within, say, a VGA sized area of 640×480 pixels. The whole screen display would be displayed via port A for use by the operator, whilst port B would be set up to display only the 640×480 area on a completely separate display system without any distracting control information.

In another arrangement, port A may operate at 70 Hz for a standard graphics display and port B operate at 50 Hz. The independent nature of the ports means that neither one of the displays has to have its quality sacrificed in deference to the other.

Again it is seen that the graphics and video are mixed in the store area. By doing this, rather than combining them after the store as in our U.S. Pat. No. 5,027,212, the danger of 'frame dropping' is avoided. Frame dropping can arise if, say, an input at 50 Hz frame rate is converted to 60 Hz or 70 Hz for display, and the resultant signal then converted back to 50 Hz for other purposes. Occasional frames can be omitted completely. By independently outputting the signals at two different rates, and synchronising the output 50 Hz signal with the input 50 Hz signal, the danger is avoided.

Video Rate Output

The SAM B port can be used to output RGB data from the graphics store at an average rate suitable for encoding into standard line rate baseband video. The region to be output is controlled by specifying appropriate row and column addresses for the core-to-SAM transfers. This occurs independently from the high resolution graphics raster output from SAM A.

In this system, digital video data can be sampled at between 12 and 15 MHz, dependent on the video system in use. This data rate uses less than half of the bandwidth of the pixel-wide SAM B port. It is therefore possible concurrently to input and output video-rate data through the same SAM port. In fact, the logistics of input to and output from different regions in the graphics store through a single bidirectional port mean that substantial blocks of pixels, typically one whole line, must be transferred in each direction alternately, so rate buffering is needed to utilise the bus bandwidth effectively. If the video input and video output are the same TV standard and are synchronised, then the minimum buffer size required is just over half a line for each direction.

For simplicity, the above description assumes a one-to-one mapping between video pixels and graphics pixels. A PAL frame of 768 by 576 pixels would occupy a window of up to 768 by 576 pixels in a graphics display area of, for example, 1024 by 768 or 1152 by 900 pixels. A reduced window size can be obtained by cropping the video using the video masking feature described above. The versatility of video input/output can be extended by scaling the video image in X and Y before it is written to the SAM port. The window does not then need to be the same size as the video image.

Print To Tape Option

In particular the area chosen can be read out of the TPRs and output straight into a digital encoder and converted to an appropriate format for outputting straight to a videotape or similar storage or display device. Hence no external unit would be required for displaying all or part of the display in two different formats simultaneously or recording all or part (e.g. just the required application window) direct to videotape. In particular, there is no intermediate conversion of the signal into analogue form.

To generate the best possible image quality where the required area is to be saved to tape, the data can be read out at the best possible rate to convert directly to the destination format without generating any unwanted artefacts. This is possible because the port B data read out is completely independent of port A display. For example, NTSC requires 640×480 at 30 frames (pictures) per second interlaced which, whilst not being a computer graphics display standard, could easily be generated directly from port B, such as by a digital encoder 58.

Other Applications

Other functions can be acheived as indicated in the following outlines:

(i) Scrolling rectangular areas: The TPR mask register is set up to provide a rectangular mask area corresponding to the area to be scrolled vertically (up or down). The whole of a display line containing some part of the area to be scrolled is transferred into register B. A masked transfer of the register is then performed to the destination line in core memory. The write operation only takes place to the unmasked area corresponding to the data required to be scrolled.

(ii) Pattern Fills: To fill a rectangular area of memory quickly with an irregular pattern can be achieved by using part of the (non-visible) TPR memory as a dedicated store for the pattern. Typically this is repeated over several display lines on the screen proper when written to an area to be filled. The mask register is set up to enable writes only to the area to be pattern-filled. A line of the pattern is read from the storage area into the serial register B, and then transferred by a masked write operation to the appropriate screen area. If the pattern is identical for every line further transfers take place to write the entire area. Where the pattern repeats every n lines the first pattern line is written to every n'th screen line as required. The next pattern line is then transferred to the serial register and written (again under the mask) to every (n+1) the line. Patterns can alternatively be stored in the SRAM 40 in the accelerator (FIG. 3) and downloaded as required, or even generated by the host processor and written to the TPRs via the DRAM port.

(iii) Image Rotation: Rotations can be performed by shearing in X followed by a shear in Y. The accelerator of FIG. 3 can be used to perform an X shear. To perform a Y shear requires successive scrolls of narrow parts of the image using the algorithm outlined above.

(iv) Video Image Reversal: In teleconferencing it is helpful if the video image can be displayed on the screen in reversed format (left to right). This can be achieved during video input by placing a buffer line store between the digital decoder 34 and the TPR port B. Data is stored in the buffer line store in the usual left to right fashion from the incoming video stream. Data can then be read out of this store in reverse order and written into the display in the reversed format.

General Display of Data

The use of the TPR 30 and the second serial port 32 makes it very easy to display any sort of data mixed with graphics. Digital video may be a specific example. However in general there are many sorts of processing systems where the architecture of the memory system is tailored specifically to the sort of algorithms being performed. This is not usually the same architecture as is required for a display system. Hence data generated and stored in a special-purpose memory array must be read from that memory, modified and then written into the normal display memory. These operations take processing power and involve loss of memory bandwidth of both the special purpose processing systems and of the host graphics system. In general, real time update of generated data is very difficult.

The system architecture described removes the bandwidth loss on the graphics system, that is to say the loss of throughput capacity through the random access port 24 that would otherwise occur. However by using additional VRAMs (or TPRs or other dual ported RAM) instead of normal DRAMs within the special purpose processor's memory, data can be read directly from that memory and written directly into the TPRs for display. Hence the only overhead on the special purpose processor is the occasional transfer cycle (similar to refresh).

A possible extension is to provide a direct link between the TPRs and say a disk or other serial data generating device through the second serial access port. This link can be bidirectional. For example a disk can provide source data (graphics or otherwise) which can be written directly to the screen without any system overhead. The reverse can also happen where the host processor can generate graphics images (or any other sort of data) which can be written directly to a disk or other storage device in real time without processor overhead.

Improper Mask Usage

One problem can arise with the system described which incorporates a mask plane, in that the processor 12 may change the mask data after the mask plane has been transferred into the serial register 36. Any subsequent transfer will then use an old write mask, and the wrong information will be placed into the core 14. This can lead to video input destructively overwriting graphics data. This happens when video data is being written to the same line as graphics but because of video line pipelining the write mask for the video is old data. Some solutions to this problem will be described.

(i) The first solution involves checking whether any graphics write operation will modify the write mask in any way. This special case is then handled by first disabling video input, then synchronising to a 'safe time event', then doing the graphics operation, and finally re-enabling the video input. Such operations can be handled by a display window manager system. The hardware needs a control bit to enable/disable video input. This will only stop/start the video at video input field boundaries thus giving a "clean" effect. The 'safe time event' can then be a video input field interrupt. Synchronisation can then involve a simple wait-for-interrupt instruction. The graphics operations can then proceed as normal. Finally when the graphics operations, with the new valid write mask (in say bit25 of the memory), have been completed, the video can be re-enabled and the hardware can begin cleanly from a new field boundary. These steps are illustrated in the flow chart of FIG. 5.

This approach is simple to implement and only suffers from the drawback of temporarily halting the video input whilst graphics is actually being written over inlaid video. The biggest problem then arises if a purely graphics-based cursor is used, as any cursor movement over the video could lead to unpleasant juddering effects. It would then be possible to use an extra four bits of graphics planes (bit25 to bit28). One bit of this is the write mask. This leaves three bits available for overlay graphics, for which write masking is unnecessary. These bits can be fed directly to a palette for creating any overlay effects as needed.

(ii) A second solution involves a hardware trap mechanism which generates a "conflict" signal when graphics access is attempted into a 'danger area' where video input is currently using an old write mask. The conflict signal can be used to hold the bus acknowledge signal or generate a bus fault, thus holding off graphics access and hence resolving the conflict.

The danger area is 256 or 512 pixels long, depending on whether split register write is used in the MT43C4257 or not, and most usually falls along a raster scan line. The trap hardware shown in FIG. 6 consists of a range comparator 60 which looks at the current video input SAM block write address and any GSP (graphics system processor) data write cycle that is decoded into VRAM.

It is possible to use the conflict signal to hold the bus acknowledge handshake off. This results in a totally software-transparent solution. If problems occur (like excessive refresh latency) with holding the bus off for this length of time (up to one video input line time) then bus faulting could be used. The bus fault handler should simply wait (say 0.25 of a video input line time) and then just restart the cycle again.

The required hardware is closely coupled to the video input. The comparator range has to cover the address size of the danger area, and as such it only needs to look at 10 address lines, assuming that an external input from the address decoder can validate the comparison to in-VRAM access cycles only. Assuming the video input cicuitry comprises an ASIC (application specific integrated circuit), only one extra signal line is needed to output the conflict signal. The advantage of this method is that it never has to freeze the video but resorts to stuttering the graphics. However, conflicts are relatively rare events and should not impact performance noticeably. Event resolution is aided by writing the graphics data in the opposite direction to video input access into the VRAM, as the two address streams are going in opposite directions and hence pass through each other quickly.

(iii) A third solution also uses a hardware trap to generate the "conflict" signal to indicate the modification of an old write mask. However, in this case the conflict signal is used to change the transfer mode of the video line currently being loaded. One of two actions can be taken. Either the current video line is not written, or it is written to a non-display area of memory and subsequently transferred back to the correct position in memory.

In the first case, of not writing the video line, then no action need be taken other than not to complete the video transfer for that line. The-net effect is that the current contents of the memory, which is the corresponding video line of the previous frame, is frozen.

In the second case the video line is written to a predetermined non-display area of the memory by changing the address it is written to. The GSP can then be interrupted and subsequently take corrective action to transfer the video line back to the correct memory area.

(iv) Finally a fourth method is to avoid the possibility of improper mask usage by ensuring that the mask plane is modified in advance of the graphics memory rather than at the same time. This is achieved by putting a time delay between mask and graphics memory write operations during any processor write accesses. This is best achieved in software by the display window manager which would implement a delay of one video line time whenever graphics is written into a video window.

An alternative is to implement the delay in the GSP, by writing the mask but displaying the transfer of graphics into the main graphics memory until the end of the current video line in response to video line interrupts.

System Block Diagram

Figure 7:
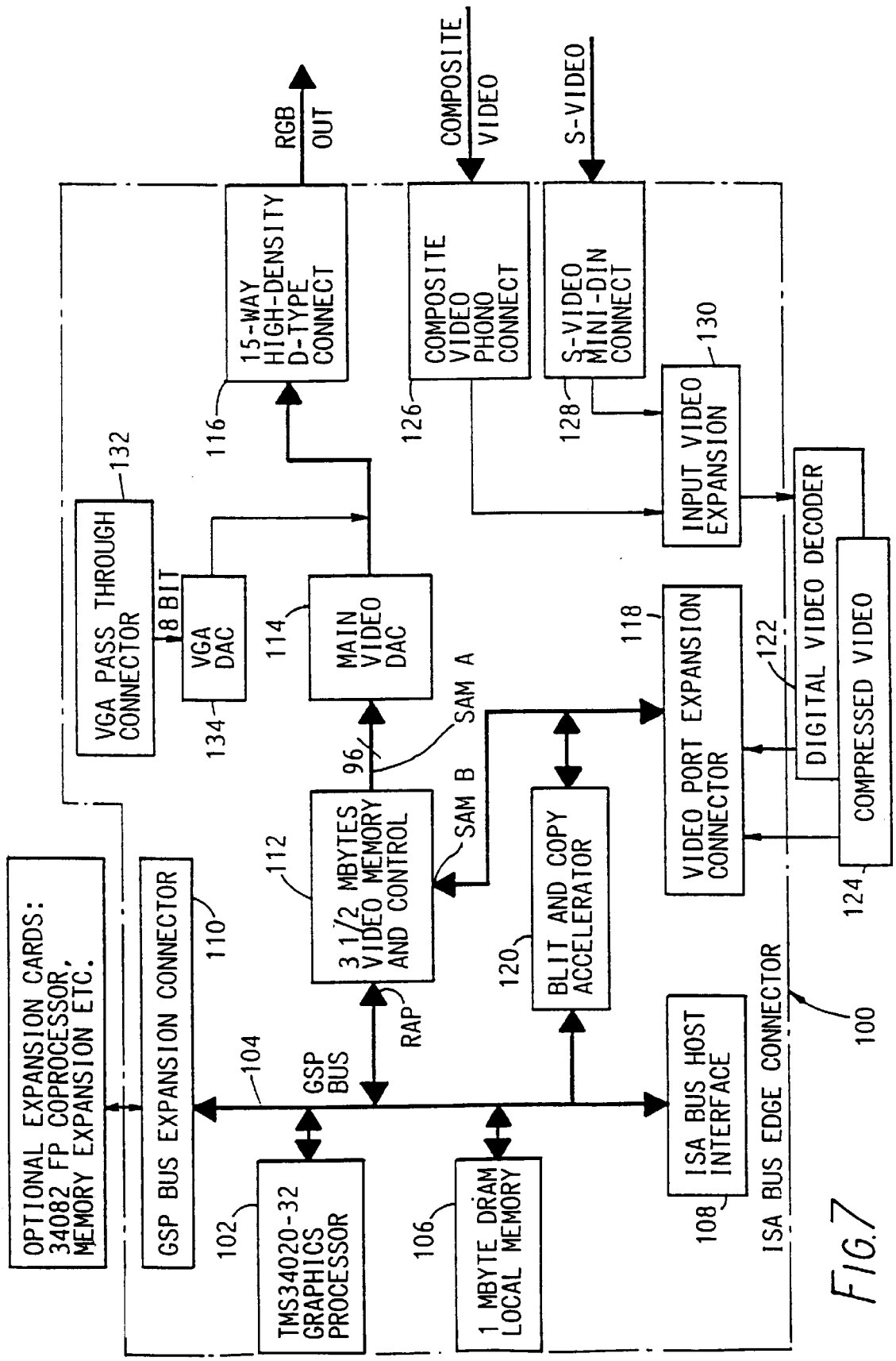
FIG. 7 is a block circuit diagram of a PC expansion card on which the system may be mounted.

The system can be implemented on an AT format expansion card as used in an IBM compatible personal computer. The general functional block diagram of the preferred system is shown in FIG. 7. The card has an ISA bus interface.

The card 100 shown has a TMS34020-32 graphics processor 102 with an associated bus 104. A one megabyte DRAM local memory 106 is coupled to the bus 104. The bus also terminates in an ISA bus host interface 108 and edge connector and in a bus expansion connector 110. The main memory comprises 3.5 Mbytes of video memory 112 with its appropriate control. The random access port RAP of the memory is coupled to the bus 104. The memory 112 is constituted by TPRs, and the first serial port SAM A is coupled to the main video DAC(s) 114, which provide a high resolution RGB output through a connector 116. The second serial access port SAM B of the memory 112 is connected to a video port expansion connector 118 and to a blit and copy accelerator 120. The accelerator 120 is based on FIG. 3. The video port expansion connector 118 can be coupled to video input cards such as a digital video decoder 122 or a compressed video card 124. These cards receive input video from the card 100. This can either be composite video through a connector 126 or S-video (luminance and chrominance or Y/C) through a connector 128. In each case it is applied to the video input cards 122, 124 through an input video expansion port 130. Finally a VGA pass-through connector 132 receives analogue video that might be required to be displayed together with the output of the memory 112. The connector 132 is connected to a VGA (video graphics adapter) DAC 134, the output of which is applied to connector 116.

The 34020 processor 102 is the control and graphics processor for the card with 1 Mbyte of local memory 106 for program storage and for holding command lists passed to it from the host processor via the ISA bus. The 34020 bus 104 is fully available on the expansion connector 110 for support of multiple 34082 coprocessors, additional memory or other processing engines on a daughter card.

The graphics accelerator 120 is directly under the control of the 34020, and has direct access to the video memory 112 for maximum performance. The accelerator is as illustrated in FIG. 3 and uses the additional serial port. The copy accelerator 120 is optimised for copy functions such as window scrolling and moving and general bit-blitting functions, that is movement about the display with logical operations being effected at the same time.

The graphics accelerator 120 provides a very fast pixel copy engine that can sustain bit-blitting and move/scrolling operations at up to eg. 20 Mpixels/sec whilst some simple pixel replication or pattern fill operations can be run at up to eg. 4 Gigapixels/sec.

The 1 megabyte of local DRAM memory 106 on the graphics system processor (GSP) bus 104 can take the form of a VRAM memory. It could also be directly connected to the graphics accelerator 120 by a serial link (not shown), so that it can be used as a cache store. When a window covers up part of the image, the overlaid part can be dumped through the SAM B port to RAM 40 in the accelerator and hence quickly and directly to the 1 Mbyte DRAM memory 106 without involving the graphics processor bus 104.

As illustrated 3.5 Megabytes of video display memory 112 are provided. This can take the form of a 1 Mpixel array of 4 bit overlay pixels. The memory array drives the main video DAC 114. The video memory and DAC are fully software configurable. In conjunction with a clock synthesizer it is therefore possible to drive virtually any monitor and to generate virually any screen format (up to 1 M displayable pixels) under software control. The separate DAC 134 is provided to support host VGA pass through.

Expansion for support of a video input option daughter card is provided in the form of the two connectors 126, 128 for S-video and composite video input and by providing the general purpose high speed (up to 120 Mbytes/sec) port 118 to or from the video memory system.

Processing Video Input

Where it is required to mix an incoming video signal received at the video port expansion connector 118 with graphics held in the TPR memory 112, it is possible to apply the video input at video rates to the accelerator 120, to withdraw from the TPR 112 at video rates the corresponding part of the image held in the TPR which it is intended to mix it with, do the mixing, and return the resultant to the store 112.

The alternatives would be to mix the video with the SAM A output, in which case the SAM A output can only run at video rates rather than the much higher graphics standard, or to store the video in a separate frame store, which is expensive. Furthermore, the resultant of the mixing is instantaneously viewable on the display. The system just described has substantial advantages over both these alternatives.

If the video input signal is an interlaced signal, the processing in the copy accelerator 120 or in a separate processor coupled to the video port expansion connector 118 can comprise an appropriate interpolation algorithm so as to provide a progressively-scanned (non-interlaced or sequential) signal. The interpolation can use lines of the incoming video and lines held in the TPR 112, and can be movement adaptive. The lines held in the TPR will in this case have already been through a previous interpolation; they will not be 'virgin' input lines, and the interpolation algorithm needs to take account of this. In particular there may need to be a threshold level at which interpolation cuts out so that there is not an unacceptable exponential decay, or blurring, on the image. A two-line (or larger) store is required to hold lines withdrawn from the TPR.

DRAM Port

Most if not all of the functions described above could in principle be achieved by accessing the video memory 112 not through the serial port SAM B but through the conventional VRAM random access port RAP from the GSP bus 104. In practice that is not practicable with present technology because the capacity of the DRAM port is insufficient at the present time. The second serial access port SAM B greatly facilitates the operations and renders them a practical possibility with current technology. Nevertheless many of the functions described are themselves new and inventive, whichever port be used to achieve them. Some alternative configurations will now be described.

SECOND EMBODIMENT

As has previously been described, the conventional graphics system uses VRAM which has a random access port for access by and to the processor and a serial access port for providing an output to the display through a digital-to-analogue conversion system. In the first embodiment described above, memories with additional ports are used which allow (for example) video to be input on a third port, this being a second serial port. This solution has substantial advantages and overcomes the performance bottleneck which arises in the conventional VRAM configuration. However it requires the use of special more expensive memory devices. More generally, multi-media systems involving combined graphics and video in a single frame buffer, and multi-processing systems requiring tightly-coupled and high-bandwidth communication between different processors are increasingly facing these issues.

The remaining embodiments provide alternatives that emulate much if not all of the functionality of the TPRs of the first embodiment, by specific arrangement and control of the memory devices. An efficient and cost-effective system can be provided for video/graphics and multi-processing applications. The second embodiment uses standard VRAM video memories. All the systems described allow the maximum bandwidth available from such memory devices to be exploited.

Figure 8:
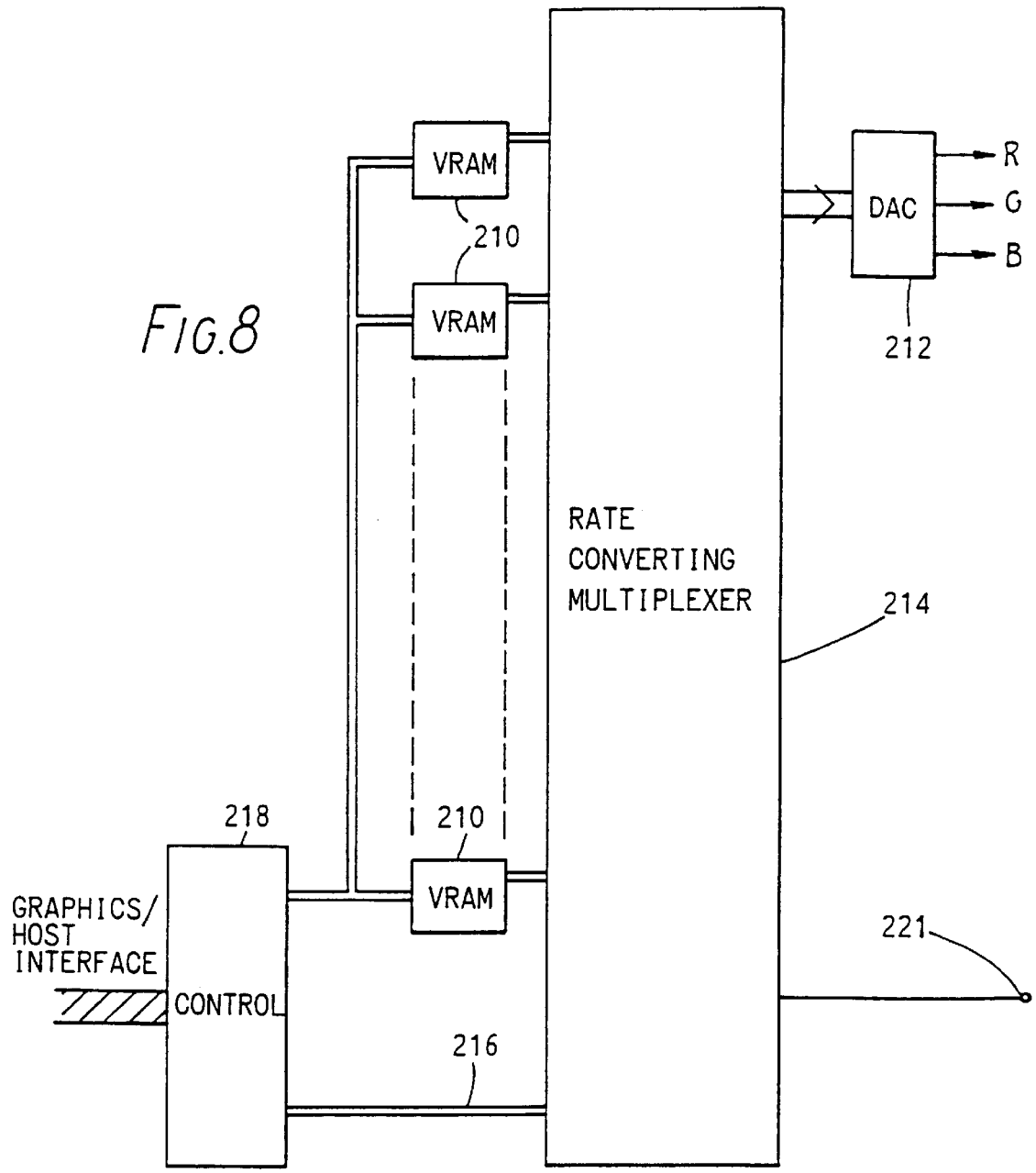
FIG. 8 is a block diagram of a memory system in accordance with a second embodiment of the invention.

Referring first to FIG. 8, a bank of conventional VRAM memories 210 have their random access ports connected via a bus to a control subsystem 218 which communicates with the graphics or host processor via an interface. The serial access ports of the VRAM memories are connected to DAC circuitry 212, which outputs the R,G,B signals for display, via a rate converting multiplexer 214. The multiplexer 214 has either an auxiliary port 216 which is coupled to the processor through the control subsystem 218, or communicates with an external auxiliary port 221, or both.

The system illustrated in FIG. 8 relies on our appreciation that in most conventional systems the actual bandwidth available at the interface between VRAMs 210 and DACs 212 is much higher than that needed by the display line rate. The additional unused bandwidth is often a result of the mismatch that exists between the available VRAM standards and the resolution requirement of the display standards. The technique therefore involves the introduction of the rate converting multiplexer 214 which allows this bandwidth to be split up or multiplexed between that needed by the pixel rate for DACs and an auxiliary port that can be used to input and output video graphics and processed image data.

The rate converting multiplexer receives output from the serial ports of the VRAMs 210 at their maximum transfer rate. In this way the time required to output the display data is such that a proportion of the time is unused. During this unused time the multiplexer then connects the serial VRAM ports to an auxiliary port, namely either the auxiliary port 216 or the external auxiliary port 221. When so connected data can be transferred through the serial access port without interrupting the processing through the main random access ports of the VRAMs.

Figure 9:
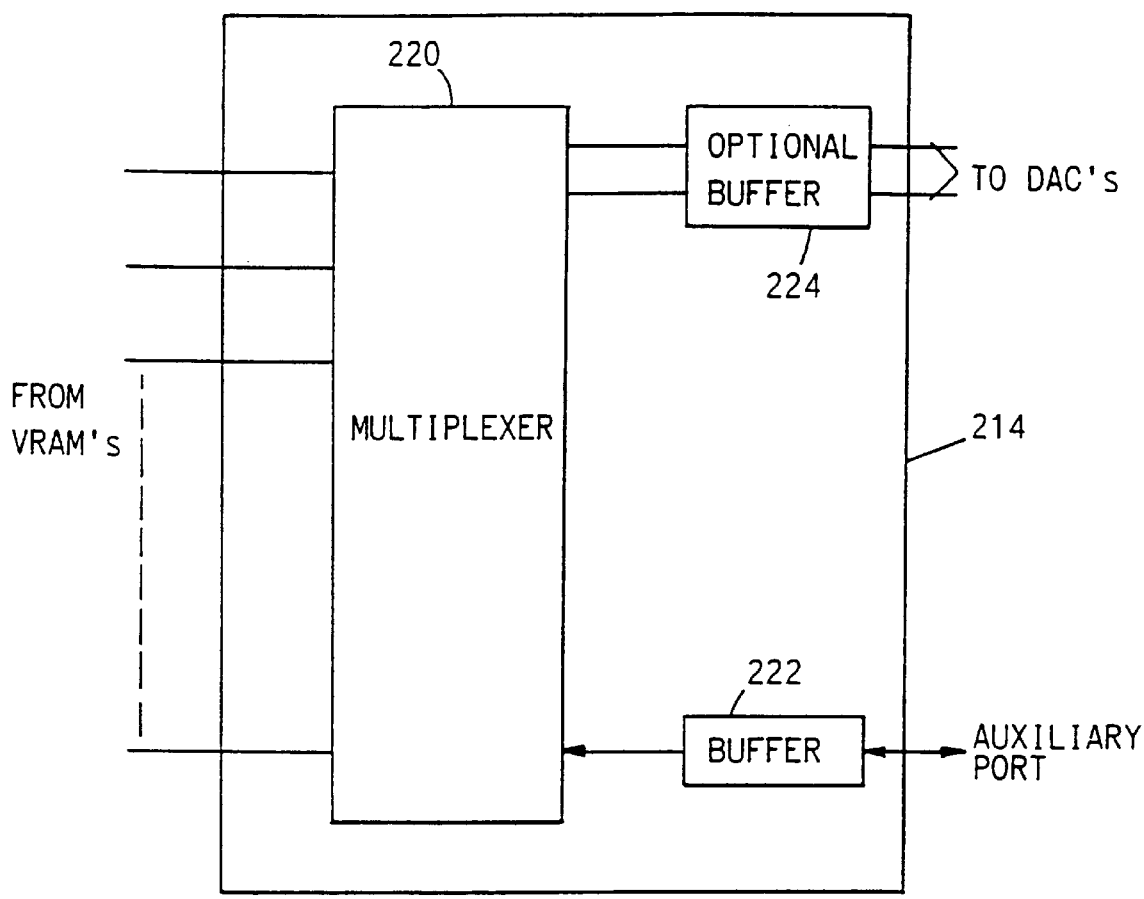
FIG. 9 illustrates the construction of the rate converting multiplier of FIG. 8.

Depending on the organisation of the VRAM and display requirements, the details of the rate converting multiplexer 214 and the function provided by the control subsystem 218 will be different. FIG. 9 shows the various components of the rate converting multiplexer 214. This unit consists of a data multiplexer 220 and rate buffers 222,224. Depending on the VRAM organisation and display requirements, the buffer 224 on the DAC port may or may not be needed. The rate buffers allow both DAC and auxiliary ports to run at independent rates.

Figure 10:
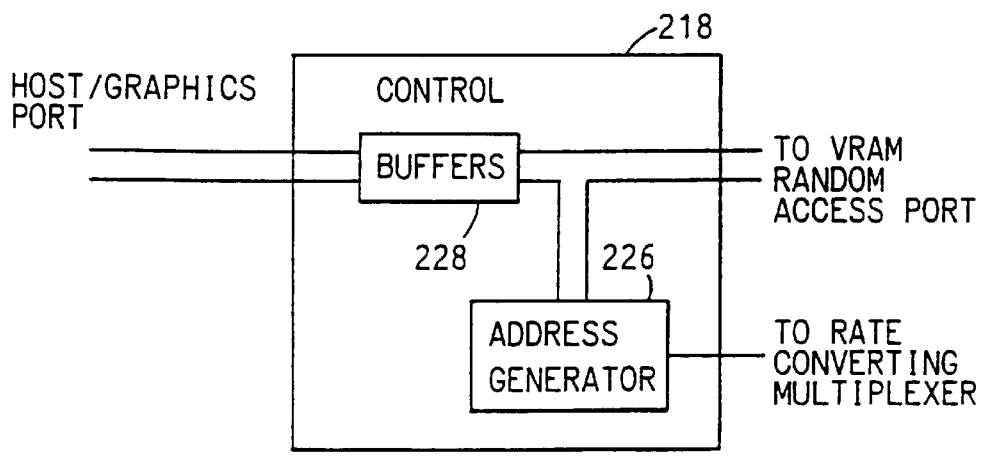
FIG. 10 illustrates one possible construction for the control unit of FIG. 8.

The control subsystem 218 in FIG. 8 is responsible for generating suitable VRAM transfer cycles so that the required data is transferred for the VRAM core memory to the serial shift registers inside the VRAM. FIG. 10 shows a block diagram of the control unit 218. When required, an address generator 226 within the control unit takes control of the bus on the random access port 216 of the VRAM to Execute the required transfer cycles. Buffers 228 are included in the bus between the host/graphics port and the address generator 226.

Figure 11:
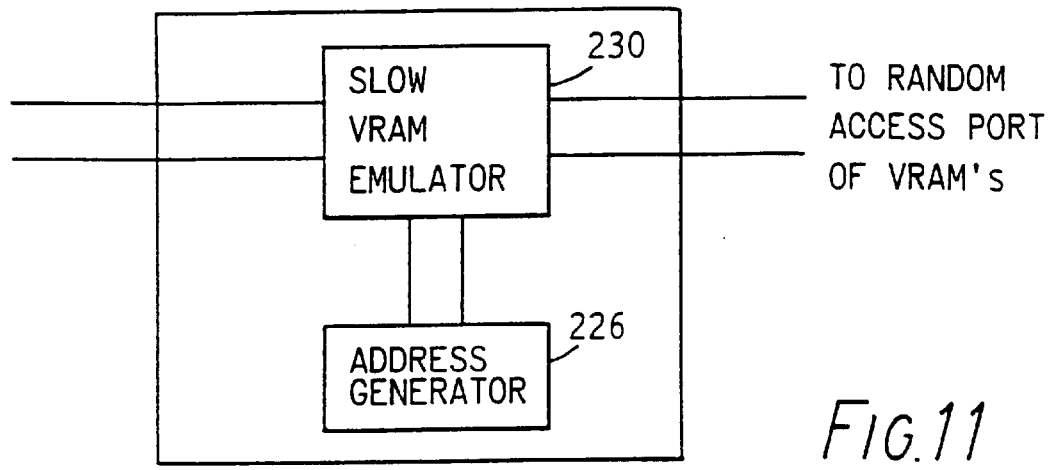
FIG. 11 illustrates an alternative construction for the control unit of FIG. 8.

An alternative way of implementing the control unit is shown in FIG. 11 where a slow VRAM emulator 230 transparently steals cycles on a fast VRAM so that the host/graphics system sees a slightly slower cycle. The address generator 226 uses the stolen cycles to execute the needed transfer cycles. It should be noted that the actual bandwidth taken by the control unit will only be a small percentage of the overall bandwidth.

THIRD EMBODIMENT

Figure 12:
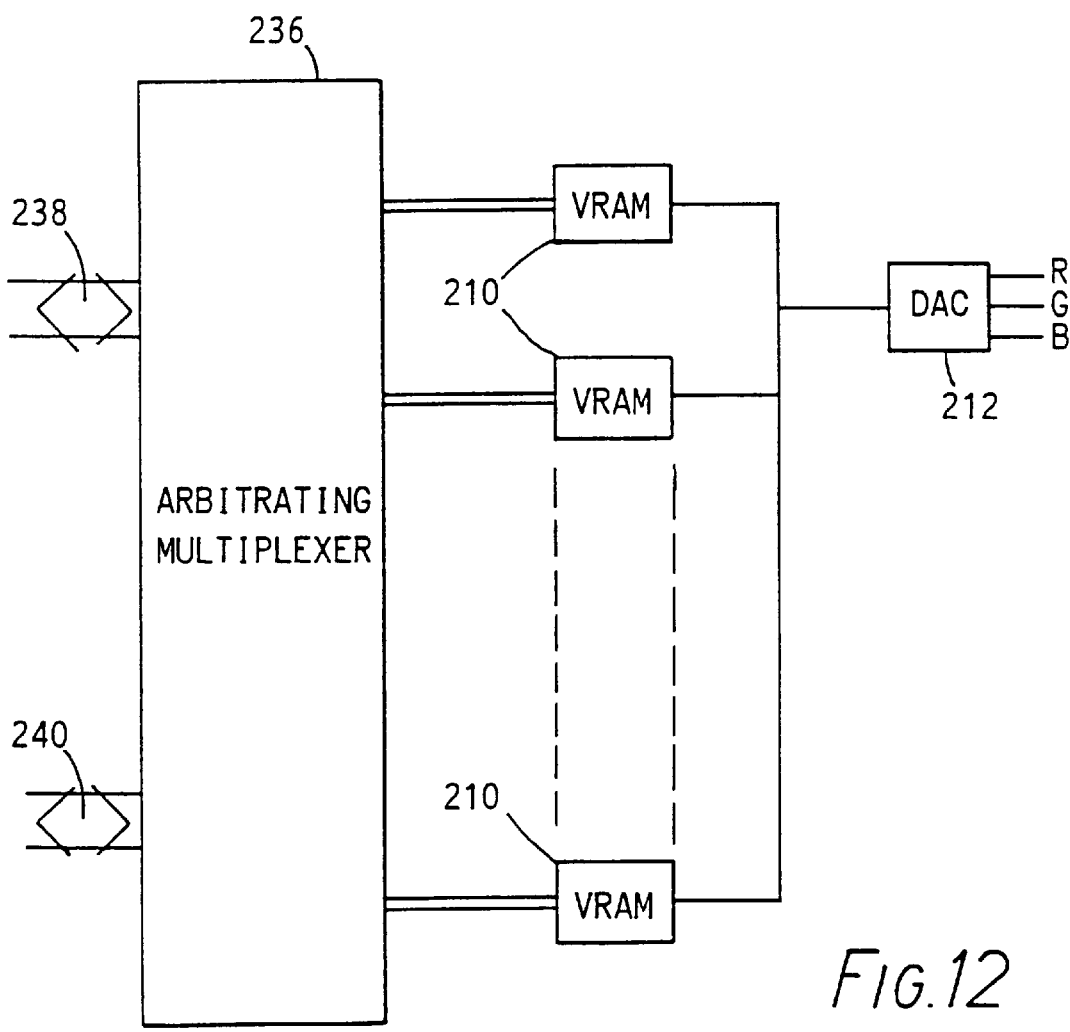
FIG. 12 is a block diagram of a memory system in accordance with a third embodiment of the invention.

Referring to FIG. 12, which is also based on the use of standard VRAM memories 210, in this case the serial access ports of the VRAM memories are coupled directly to the DAC circuitry 212, as is conventional. In this case an arbitrating multiplexer 236 is included between the random access ports of the VRAMs and the host or graphics processor bus. The arbitrating multiplexer has a first port 238 connected to the processor bus, and also a second, auxiliary port 240.

The system illustrated in FIG. 12 relies on the fact that in most graphics systems unused bandwidth also exists on the parallel signal random access port of VRAMs. This unused bandwidth or capacity stems from the need to use multiple VRAM banks to achieve the required graphics resolution and pixel rate. The technique therefore involves the introduction of the arbitrating multiplexer 236 which allows the overall bandwidth to be split between the host/graphics processor port 238 and an auxiliary port 240. The auxiliary port can be used to input or output video, graphics or processed image data The details of the arbitrating multiplexer may vary depending on the organisation of the VRAM and display requirements.

Figure 13:
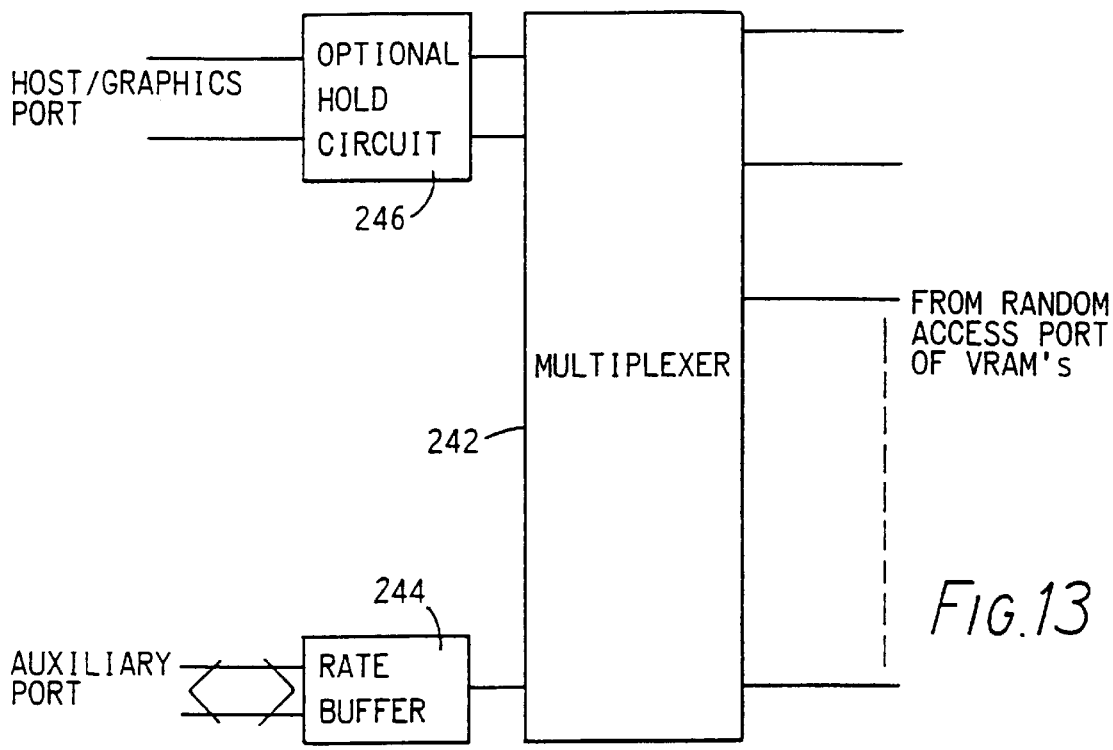
FIG. 13 ilustrates the construction of the arbitrating multiplexer of FIG. 12.

FIG. 13 shows the various components of the arbitrating multiplexer 236 of FIG. 12. It includes a data multiplexer 242. A rate buffer 244 on the auxiliary port is optional and decouples the data rate on this port from actual access into the VRAM.

The host/graphics port is handled in one of two ways. The host/graphics system can be put into short wait states whilst the current transaction between the auxiliary port rate buffer and the VRAM is taking place. This is possible in cases where the host/graphics system can respond to such wait requests. The alternative mode of operation consists of interrupting the cycle originating from/to the auxiliary port immediately when read or write requests happen on the host/graphics port, as illustrated by the optional hold circuit 246. The write requests can be delayed easily and executed after the rate-buffer access is complete.

FOURTH EMBODIMENT

Figure 14:
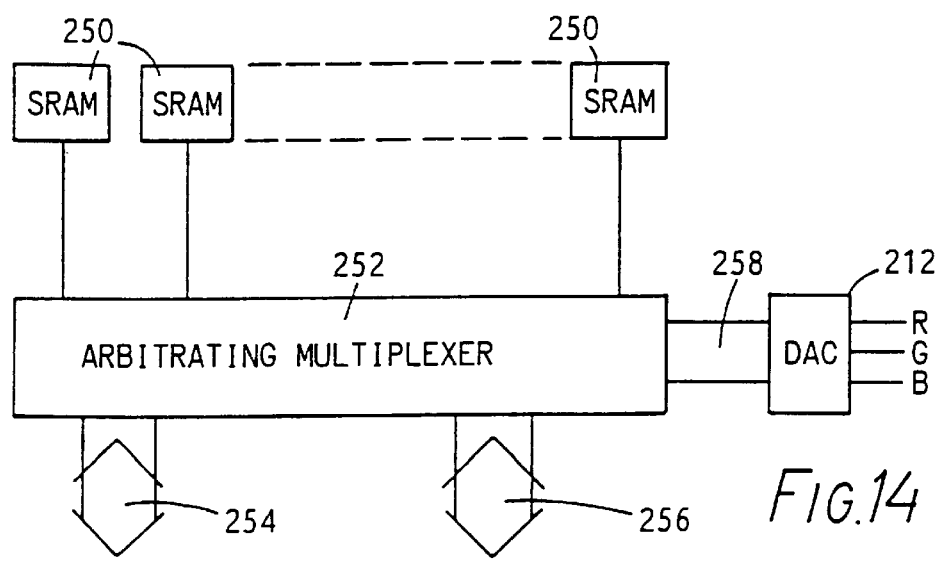
FIG. 14 is a block diagram of a memory system in accordance with a fourth embodiment of the invention, using SRAMs.

The system illustrated in FIG. 14, uses a different type of memory device 250 namely Static Random Access Memories (SRAMs). SRAMs are much faster than VRAM or DRAMs and substantial bandwidth can be made available by using such devices in parallel as shown in FIG. 14. However they have only one port, namely the random access port. The SRAM devices are controlled by an arbitrating multiplexer 252 that splits the total available-bandwidth between the graphics/host interface 254, auxiliary port 256 and a third DAC output port 258 for inputting and outputting video, graphics and processed images.

Figure 15:
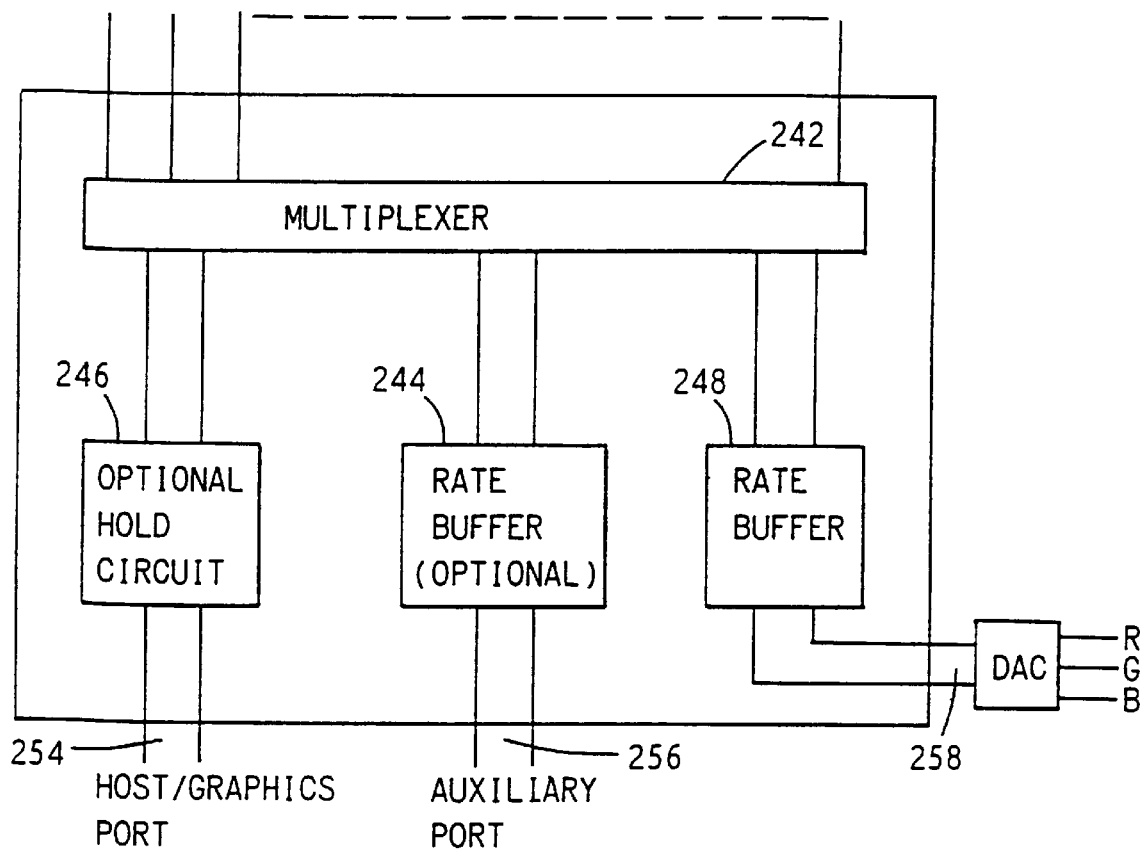
FIG. 15 ilustrates the construction of the arbitrating multiplexer of FIG. 14.

The principle and details of the embodiment of FIG. 14 are similar to the third embodiment with the addition of the DAC port 258. The construction of the arbitrating multiplexer is shown in FIG. 15. The DAC port 258, again depending on the display and SRAM configuration, may or may not need a rate buffer 248 as shown in FIG. 15. The operation of the multiplexer 242, host/graphics hold circuit 246 and the rate buffer 244 for the auxiliary port are similar to the second method of FIGS. 12 and 13.

FIFTH EMBODIMENT

Figure 16:
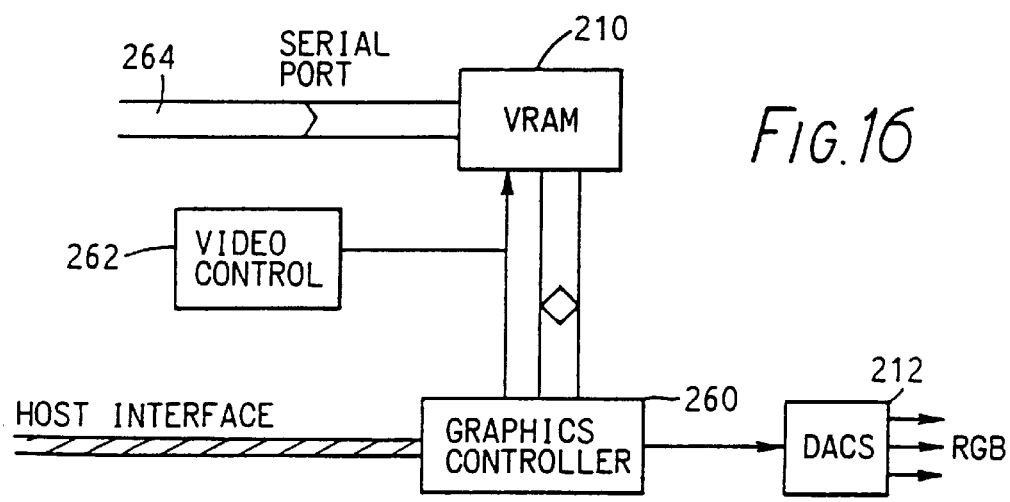
FIG. 16 is a block diagram of a memory system in accordance with a fifth embodiment of the invention.

Finally, a fifth embodiment is illustrated in FIG. 16. In this embodiment VRAM 210 is used but the serial port is not connected to the DACs 212. The VRAM random access port is connected to a graphics controller 260, such as a VGA chip, which addresses the VRAM as though it were conventional DRAM without a separate serial port. The graphics controller is connected to the host processor interface. A video controller 262 can control the VRAM on the VRAM control bus. The VRAM serial port is then used as a separate video input port 264, to allow video to be input directly into the memory.

The random access port of the VRAM is used both for host/graphics processor access and for outputting processed image data to the display. The graphics controller 260 deals with the multiplexing of host/graphics processor accesses to the memory and with outputting display data. Video is written into the memory 210 by clocking into the serial port 264. Video transfers into the core memory are handled by the video controller 262, which takes control of the memory control bus from the graphics controller and initiates a transfer cycle. This has little impact on the graphics processing since it takes a very short time to complete. Once completed, control of the VRAM memory control bus is handed back to the graphics controller 260.

In all the embodiments described it is seen that there is a RAM memory which is arranged as part of a memory system. The memory system provides a random access port which is coupled to the random access port of the RAM memory. The memory system also provides a serial access port for providing a serial output such as a graphics display. Finally, the memory system provides an auxiliary port which may be a serial port (the first, second and fifth embodiments) or a parallel port (third and fourth embodiments). In each case a single frame buffer is used to store both video and graphics data, and can be used to store processed image data derived from the stored image.

As compared with the system of our U.S. Pat. No. 5,027,212 only half the amount of memory is required.

Furthermore host processor accessing is quicker because the processor does not have to look at two separate frame stores.

The system is nevertheless capable of inputting or outputting full-motion video without the need to involve the host processor in the input or output operation. Many special features, eg. windowing and overlaying of video and graphics, can be made available. Special effects can be achieved by reading data out of memory, applying processing, and then writing it back into memory.

While the separate embodiments have been described as having different features, it is to be noted that the features of the various embodiments can be combined in ways other than those specifically described and illustrated. For example the auxiliary ports of the third and fourth embodiments could be configured as additional serial ports. Also the features of FIGS. 3 and 4 can be applied to the subsequent embodiments.

We claim:

1. In a video/graphics system comprising a processor for generating graphics data, a video signal port through which video data and graphics data are transferred bidirectionally, and a display signal output port over which an integrated stream of video data and graphics data is output and a memory means, said memory means comprising:

at least one random access memory with multiple addressable data locations and having a random access port, said data locations in said random access memory being able to store selectively both graphics data from said processor and video data wherein the graphics data and the video data are written to and read from the data locations through said random access port of said random access memory;

a random access port, said random access port of said memory means being selectively coupled to said random access port of said random access memory for connecting said random access memory to said processor for the transfer of graphics data;

a serial access port, said serial access port of said memory means being coupled to said random access memory for connecting said random access memory to said display signal output port for the transfer of video data and graphics data to said display signal output port for forwarding to an external display device;

an auxiliary port, said auxiliary port of said memory means being coupled to said random access memory for connecting said video signal port to said random access memory for the transfer of video data to allow the bidirectional transfer of graphics data and video data to and from said random access memory so that the graphics data and the video data can be written to and read from individual data locations in said random access memory through said auxiliary port and said video signal port; and an arbitrating multiplexer coupled between said random access port of said random access memory, said random access port of said memory means, and said auxiliary port of said memory means, whereby both said random access port of said memory means and said auxiliary port of said memory means have time-multiplexed access to said random-access port of said random access memory through said arbitrating multiplexer wherein the auxiliary port is allowed bidirectional transfer of graphics and video data to said random access memory through said arbitrating multiplexer.

2. The system claimed in claim 1, wherein said at least one random access memory further includes a serial access port, and said serial access port of said memory means is coupled to said serial access port of said random access memory.

3. The system claimed in claim 2, wherein said random access memory is a VRAM.

4. The system claimed in claim 2, wherein said random access port of said random access memory is a parallel signal port.

5. The system claimed in claim 1, wherein said arbitrating multiplexer is further coupled to said serial access port of said memory means whereby said random access port of said memory means, said serial access port of said memory means and said auxiliary port of said memory means each have time-multiplexed access to said random access port of said random access memory through said arbitrating multiplexer.

6. The system claimed in claim 5, wherein said random access memory is a SRAM.

7. The system claimed in claim 5, wherein said random access memory is a DRAM.

8. The system claimed in claim 1, wherein said random access port of said random access memory is a parallel signal port.

9. The system of claim 1, wherein said arbitrating multiplexer includes:

a data multiplexer having a first end coupled to receive data from said random access port of said memory means and said auxiliary port of said memory means and a second end coupled to said random access port of said random access memory, said data multiplexer being configured to connect either said random access port of said memory means or said auxiliary port of said memory means to said first random access port; and a hold circuit connected to said random access port of said memory means for monitoring when requests to write to said random access memory are received over said random access port of said memory means and connected to said data multiplexer for controlling which of said random access port of said memory means or said auxiliary port of said memory means is connected to said first random access port, wherein when a write request is received over said second random access port, said hold circuit interrupts any data transfer occurring between said auxiliary port and said random access port of said random access memory and directs said data multiplexer to connect said random access port of said memory means to said random access port of said random access memory.

10. A video/graphics system comprising:

a processor for generating graphics data representative of a graphics-based image;

a video signal port through which video data representative of a video image and graphics data are transferred bidirectionally;

a memory assembly, said memory assembly including:

a random access memory having multiple data locations in which graphics data and video data are selectively stored, a random access port through which data are selectively written to and read from said data locations and a serial access port through which graphics data and video data contained in said data locations are read from said random access memory;

a host port connected to said processor for receiving graphics data therefrom;

an auxiliary port coupled to said video signal port for receiving video data therefrom through which the video data and graphics data are exchanged bidirectionally with the video signal port; and an arbitrating multiplexer connected on a first side thereof to said host port and to said auxiliary port and on a second side thereof to said random access port of said random access memory, said arbitrating multiplexer being configured to selectively connect said host port and said auxiliary port to said random access port of said random access memory through time-multiplexed access so that said graphics data from said processor and video data from said video signal port can be written to said random access memory and graphics data and video data can be read from said random access memory to said video signal port; and an output signal port connected to said serial access port of said random access memory for receiving an integrated stream of graphics data and video data, said output signal port functioning as a port over which the integrated stream of graphics data and video data is supplied to an external display device.

11. The video/graphics system of claim 10, wherein said random access memory is a VRAM.

12. The video/graphics system of claim 11, wherein said random access port of said random access memory is a parallel signal port.

13. The video/graphics system of claim 10, wherein said random access port of said random access memory is a parallel signal port.

14. The video/graphics system of claim 10, wherein said arbitrating multiplexer includes:

a data multiplexer connected on one side to said host port and to said auxiliary port and on an opposed side to said random access port of said random access memory; and a rate buffer connected between said auxiliary port and said data multiplexer for decoupling the data transmission rate through the auxiliary port from the data transmission rate to the random access memory.

15. The system of claim 10, wherein said arbitrating multiplexer includes:

a data multiplexer having a first end coupled to receive data from said host port and said auxiliary port and a second end coupled to said random access port of said random access memory, said data multiplexer being configured to connect either said host port or said auxiliary port to said random access port; and a hold circuit connected to said host port for monitoring when requests to write to said random access memory are received over said host port and connected to said data multiplexer for controlling which of said host port or said auxiliary port is connected to said random access port, wherein when a write request is received over said host port, said hold circuit interrupts any data transfer occurring between said auxiliary port and said random access port of said random access memory and directs said data multiplexer to connect said host port to said random access port of said random access memory.

16. The system of claim 15, wherein:

said data multiplexer reads and writes data from said random access memory at a first rate, and when data is exchanged between said random access memory and said auxiliary port, said the data is exchanged through a rate buffer wherein data is exchanged between said auxiliary port and said rate buffer at a second rate that is decoupled from and less than the first rate; and said hold circuit delays interrupting data transfers occurring between said auxiliary port and said random access port of said random access memory in response to write requests received by said hold circuit until after data in said rate buffer is accessed for the data stored in said rate buffer.

17. A video/graphics system comprising:

a processor for generating graphics data representative of a graphics-based image;

a video signal port for receiving video data representative of a video image;

a serial access port through which an integrated stream of graphics data and video data can be forwarded to an external display device; and a memory assembly, said memory assembly including:

at least one random access memory with multiple data locations, said data locations being used to selectively store both graphics data and video data and a random access port through which graphics data and video data are written to and read from the said data locations;

a host port, said host port being connected to said processor to allow the transfer of graphics data from said processor to said memory assembly;

an auxiliary port, said auxiliary port being connected to said video signal port to allow the transfer of video data to said memory assembly;

an arbitrating multiplexer connected at a first end to said host port, said auxiliary port and said serial access port and at a second end to said random access port of said random access memory, said arbitrating multiplexer being configured to provide time-multiplexed access to said random access port of said random access memory so that graphics data from said processor and video data received from said video signal port can be selectively written to said data locations of said random access memory and graphics data and video data can be read from said data locations of said random access memory through said serial access port.

18. The video/graphics system of claim 17, wherein said arbitrating multiplexer includes:

a data multiplexer connected on one side to said host port, to said auxiliary port and to said serial access port and on an opposed side to said random access port of said random access memory; and a first rate buffer connected between said auxiliary port and said data multiplexer for decoupling the data transmission rate through the auxiliary port from the data transmission rate to the random access memory.

19. The video/graphics system of claim 18, wherein said arbitrating multiplexer includes a second rate buffer connected between said serial access port and said data multiplexer for decoupling the data transmission rate through the serial access port from the data transmission rate from the random access memory.

20. The video/graphics system of claim 17, wherein:

said memory assembly includes a plurality of said random access memories, said random access ports of said random access memories being connected to said arbitrating multiplexer;

a plurality of said serial access ports are provided through which integrated streams of graphics data and video data are forwarded to the external display device; and said arbitrating multiplexer is configured to connect said random access ports of said random access memories in parallel to said serial access ports.

21. The video/graphics system of claim 17, wherein said host port, said auxiliary port and said arbitrating multiplexer are configured to allow bidirectional data transfer between said video signal port and said data locations in said random access memory.

22. The system of claim 17, wherein said arbitrating multiplexer includes:

a data multiplexer having a first end coupled to receive data from said host port, said auxiliary port and said serial access port of said memory assembly and a second end coupled to said random access port of said random access memory, said data multiplexer being configured to connect either said host port, said auxiliary port or said serial access port to said random access port of said random access memory; and a hold circuit connected to said host port of said memory assembly for monitoring when requests to write to said random access memory are received over host port and connected to said data multiplexer for controlling which of said host port, said auxiliary port or said serial access port is connected to said random access port of said random access memory, wherein when a write request is received over said host port, said hold circuit interrupts any data transfer occurring between said auxiliary port and said random access port of said random access memory and directs said data multiplexer to connect said host port to said random access port of said random access memory.

23. The video/graphics system of claim 17, wherein said random access memory is static random access memory.

24. In a video/graphics system comprising a processor for generating graphics data, a video signal port for receiving video data, and a display signal output port over which an integrated stream of video data and graphics data is output and a memory means, said memory means comprising:

at least one random access memory with multiple data locations and having a first random access port, said data locations in said random access memory being able to store selectively both graphics data from said processor and video data;

a second random access port, said second random access port being selectively coupled to said first random access port for connecting said random access memory to said processor for the transfer of graphics data;

a serial access port, said serial access port of said memory means being coupled to said random access memory for connecting said random access memory to said display signal output port for the transfer of video data and graphics data to said display signal output port for forwarding to an external display device;

an auxiliary port, said auxiliary port of said memory means being coupled to said random access memory for connecting said video signal port to said random access memory for the transfer of video data; and an arbitrating multiplexer coupled between said first random access port, said second random access port and said auxiliary port, whereby both said second random access port and said auxiliary port have time-multiplexed access to said first random access port of said random access memory through said arbitrating multiplexer, said arbitrating multiplexer including:

a data multiplexer having a first end coupled to receive data from said second random access port, and from said auxiliary port and a second end coupled to said first random access port, said data multiplexer being configured to connect either said second random access port or said auxiliary port to said first random access port; and a hold circuit connected to said second random access port for monitoring when requests to write to said random access memory are received over said second random access port and connected to said data multiplexer for controlling which of said second random access port or said auxiliary port is connected to said first random access port, wherein when a write request is received over said second random access port, said hold circuit interrupts any data transfer occurring between said auxiliary port and said first random access port and directs said data multiplexer to connect said second random access port to said first random access port.

25. The system of claim 24, wherein said first random access port, said auxiliary port and said data multiplexer are configured to allow bidirectional data transfer between said auxiliary port and said data locations in said random access memory.

26. In a video/graphics system comprising a processor for generating graphics data, a video signal port for receiving video data, and a display signal output port over which an integrated stream of video data and graphics data is output and a memory means, said memory means comprising:

at least one random access memory with multiple data locations and having a first random access port, said data locations in said random access memory being able to store selectively both graphics data from said processor and video data;

a second random access port, said second random access port being selectively coupled to said first random access for connecting said random access memory to said processor for the transfer of graphics data;

a serial access port, said serial access port of said memory means being coupled to said random access memory for connecting said random access memory to said display signal output port for the transfer of video data and graphics data to said display signal output port for forwarding to an external display device;

an auxiliary port, said auxiliary port of said memory means being coupled to said random access memory for connecting said video signal port to said random access memory for the transfer of video data; and an arbitrating multiplexer coupled on one side to said first random access port and on a second side to said second random access port, said serial access port and said auxiliary port, whereby said second random access port, said serial port and said auxiliary port have time-multiplexed access to said first random access port of said random access memory through said arbitrating multiplexer.

27. The system of claim 26, wherein said first random access port, said auxiliary port and said data multiplexer are configured to allow bidirectional data transfer between said auxiliary port and said data locations in said random access memory.

28. A video/graphics system comprising:

a processor for generating graphics data representative of a graphics-based image;

a video signal port for receiving video data representative of a video image;

a memory assembly, said memory assembly including:

a random access memory having multiple data locations in which graphics data and video data are selectively stored, a random access port through which data are written to said data locations and a serial access port through which graphics data and video data contained in said data locations are read from said random access memory;
a host port connected to said processor for receiving graphics data therefrom;
an auxiliary port coupled to said video signal port for receiving video data therefrom; and
an arbitrating multiplexer connected on a first side thereof to said host port and to said auxiliary port and on a second side thereof to said random access port of said random access memory, said arbitrating multiplexer including:
- a data multiplexer having a first end coupled to receive data from said host port and from said auxiliary port and a second end coupled to said random access port, said data multiplexer being configured to connect either said host port or said auxiliary port of said to said random access port; and
- a hold circuit connected to said host port for monitoring when requests to write to said random access memory are received over said host port and connected to said data multiplexer for controlling which of said host port or said auxiliary port is connected to said first random access port, wherein when a write request is received over said host port, said hold circuit interrupts any data transfer occurring between said auxiliary port and said first random access port and directs said data multiplexer to connect said host port to said first random access port; and an output signal port connected to said serial access port of said random access memory for receiving an integrated stream of graphics data and video data, said output signal port functioning as a port over which the integrated stream of graphics data and video data is supplied to an external display device.

29. The system of claim 28, wherein said random access port, said auxiliary port and said data multiplexer are configured to allow bidirectional data transfer between said auxiliary port and said data locations in said random access memory.

* * * * *

UNITED STATES PATENT AND TRADEMARK OFFICE
CERTIFICATE OF CORRECTION

PATENT NO. : 5,943,065
DATED : August 24, 1999
INVENTOR(S) : Hossein Yassaie

It is certified that error appears in the above-identified patent and that said Letters Patent is hereby corrected as shown below:

Title page, item [75] delete the following inventors:
"John Anthony Metcalfe, Dunstable;
Graham Deacon, Hemel Hempstead;
Martin Ashton, Berkhampsted".

Column 16, lines 40-42; change "said first random
   access port, wherein when a write request is
   received over said second random access port,
   said hold" to ---said random access port of said
   random access memory, wherein when a write request
   is received over said random access port of said
   memory means, said hold---.

Column 17, lines 62; change "said the data" to
   ---the data---.

Signed and Sealed this

Second Day of May, 2000

*Attest:*

Q. TODD DICKINSON

*Attesting Officer*       *Director of Patents and Trademarks*